United States Patent
Lang et al.

(10) Patent No.: US 10,355,233 B2
(45) Date of Patent: Jul. 16, 2019

(54) ORGANIC LIGHT-EMITTING DIODE AND VEHICLE EXTERIOR LIGHTING

(71) Applicant: OSRAM OLED GmbH, Regensburg (DE)

(72) Inventors: Erwin Lang, Regensburg (DE); Arne Fleissner, Regensburg (DE); Andrew Ingle, Allershausen (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/756,969

(22) PCT Filed: Aug. 17, 2016

(86) PCT No.: PCT/EP2016/069524
§ 371 (c)(1),
(2) Date: Mar. 1, 2018

(87) PCT Pub. No.: WO2017/036800
PCT Pub. Date: Mar. 9, 2017

(65) Prior Publication Data
US 2018/0277786 A1 Sep. 27, 2018

(30) Foreign Application Priority Data
Sep. 4, 2015 (DE) .................. 10 2015 114 844

(51) Int. Cl.
*H01L 51/52* (2006.01)
*F21S 43/145* (2018.01)
(Continued)

(52) U.S. Cl.
CPC ........ *H01L 51/5203* (2013.01); *F21S 43/145* (2018.01); *H01L 51/0097* (2013.01);
(Continued)

(58) Field of Classification Search
CPC .................................................. H01L 51/5225
See application file for complete search history.

(56) References Cited

U.S. PATENT DOCUMENTS

2010/0237373 A1* 9/2010 Yamazaki ........... H01L 51/5225
257/98
2012/0256227 A1 10/2012 Tsurume et al.
2015/0280152 A1* 10/2015 Iwagaki .................. H01L 51/52
257/40

FOREIGN PATENT DOCUMENTS

DE 102008020816 A1 9/2009
DE 102010003121 A1 9/2011
(Continued)

*Primary Examiner* — Raj R Gupta
(74) *Attorney, Agent, or Firm* — McDermott Will & Emery LLP

(57) ABSTRACT

The organic light-emitting diode (1) has a first electrode (21) with a first electric conductivity and a second electrode (22) with a second lower electric conductivity. An organic layer stack (4) for generating light is located between the electrodes (21, 22). The light-emitting diode (1) further comprises a current distribution layer (3) with a third high electric conductivity. When seen in a plan view, multiple contact regions (33) are located outside of an outer contour line (40) of the layer stack (4). The second electrode (22) and the current distribution layer (3) contact each other in the contact regions (33). In a current blocking region (34), the current distribution layer (3) is located entirely within the contour line (40) such that the second electrode (22) is electrically disconnected from the current distribution layer (3). The luminous intensity of a lighting surface (11) of the light-emitting diode (1) is preferably set in a controlled manner via the distribution of the contact regions (33) and the current blocking regions (34).

13 Claims, 8 Drawing Sheets

Figure 1:
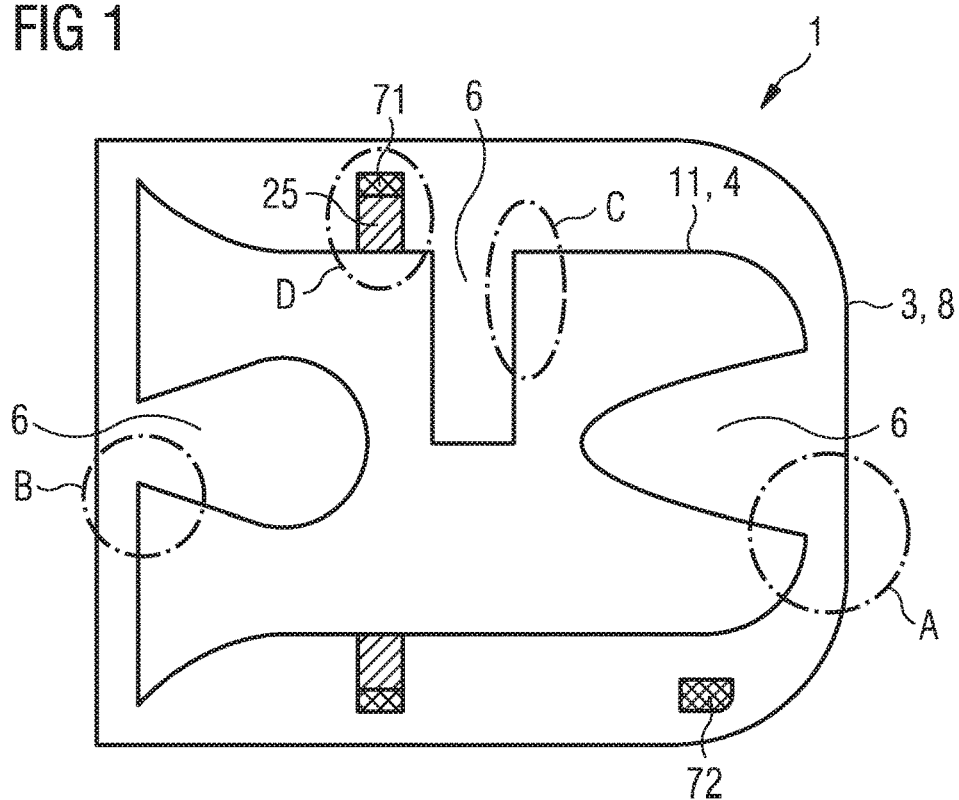

(51) Int. Cl.
*F21W 103/35* (2018.01)
*F21W 103/45* (2018.01)
*F21W 103/55* (2018.01)
*F21Y 115/15* (2016.01)
*H01L 51/00* (2006.01)

(52) U.S. Cl.
CPC ..... *F21W 2103/35* (2018.01); *F21W 2103/45* (2018.01); *F21W 2103/55* (2018.01); *F21Y 2115/15* (2016.08); *H01L 51/5225* (2013.01); *H01L 2251/5338* (2013.01); *H01L 2251/5361* (2013.01)

(56) References Cited

FOREIGN PATENT DOCUMENTS

| | | |
|---|---|---|
| DE | 112011104929 T5 | 1/2014 |
| DE | 102013105154 A1 | 12/2014 |
| DE | 102014100747 A1 | 7/2015 |
| EP | 2693841 A1 | 2/2014 |
| JP | 2009-301965 A | 12/2009 |

\* cited by examiner

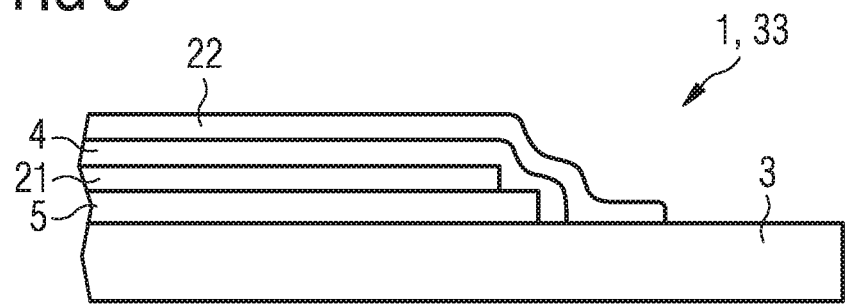
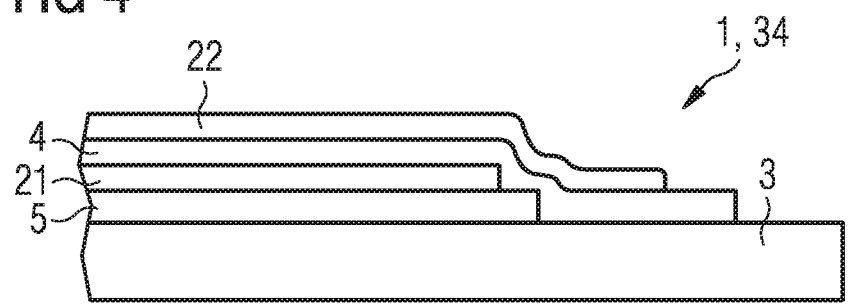
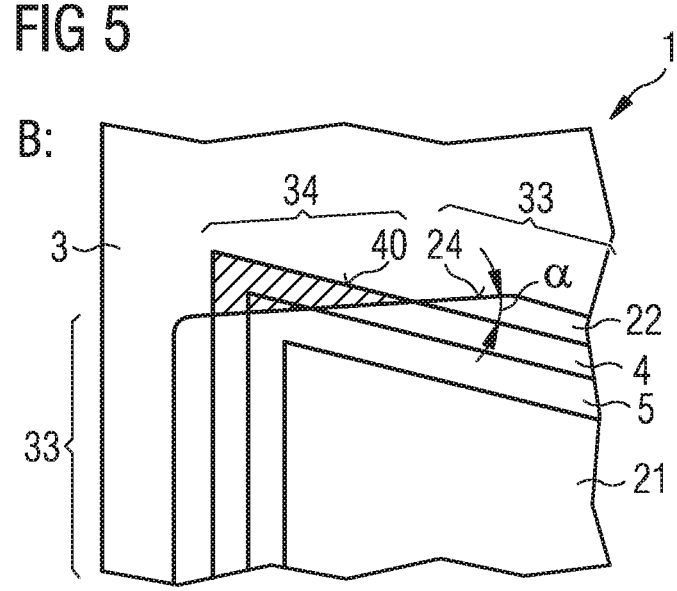

FIG 8
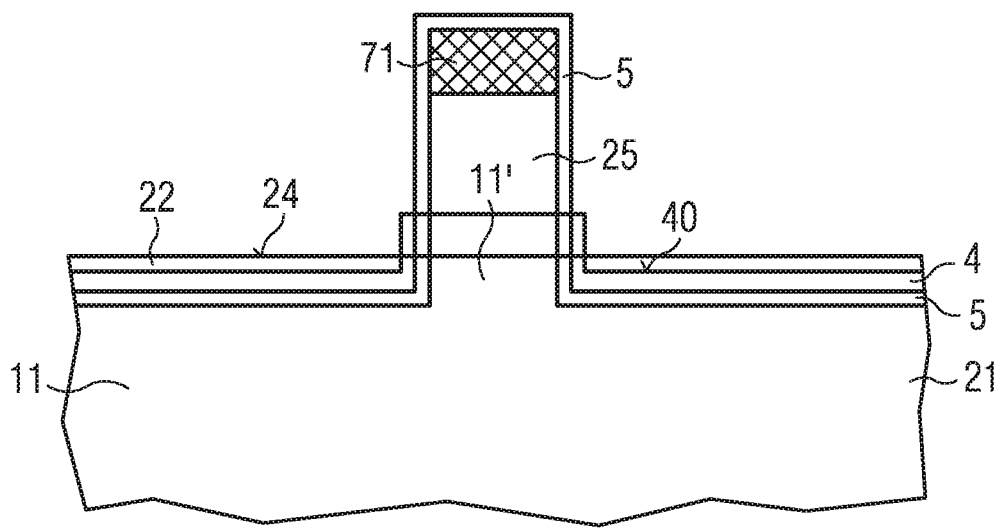
FIG 9
A)
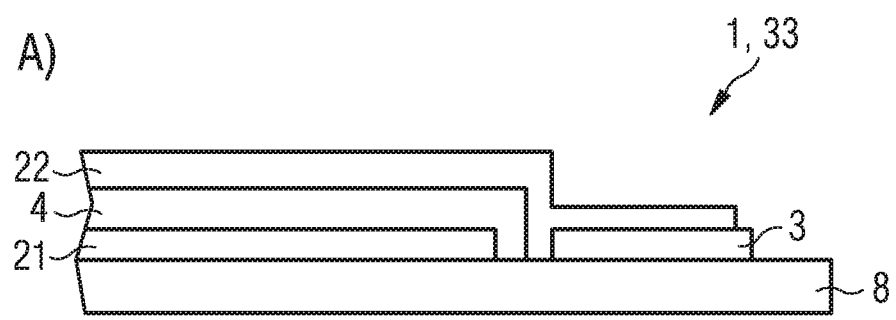
B)
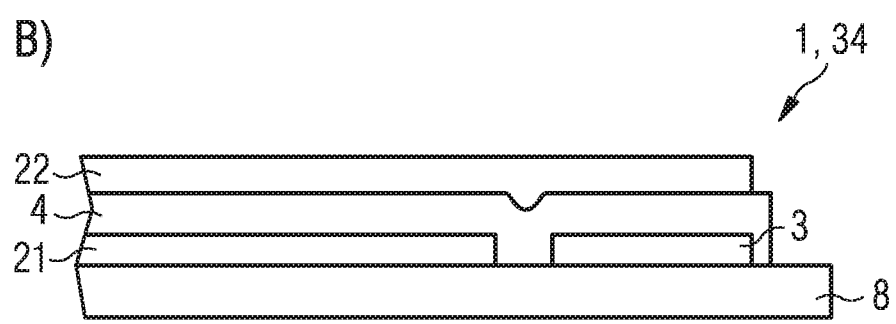

FIG 9-continued
C)
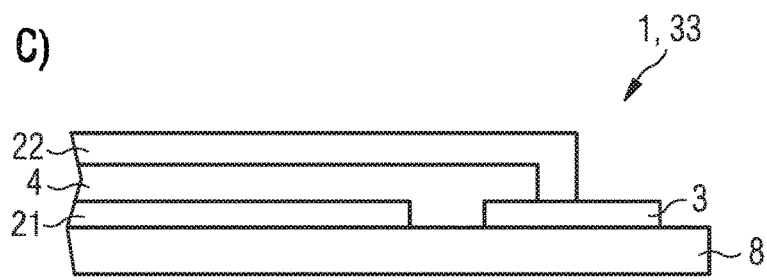
D)
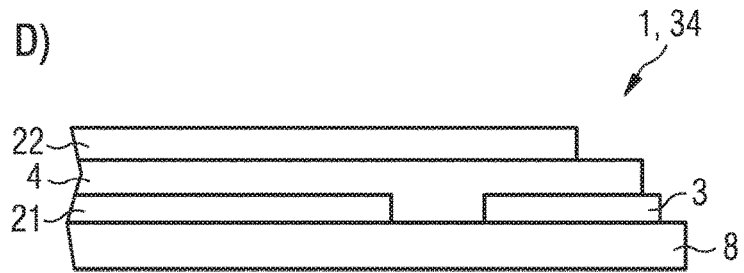
FIG 10
A)
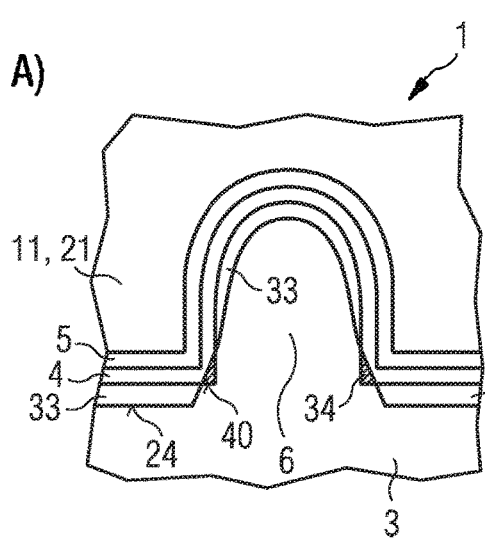
B)
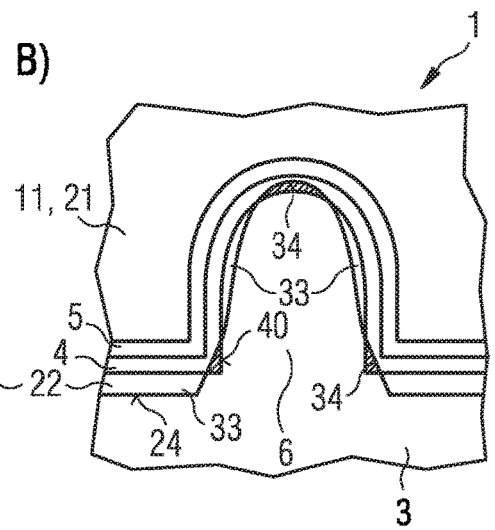

FIG 12
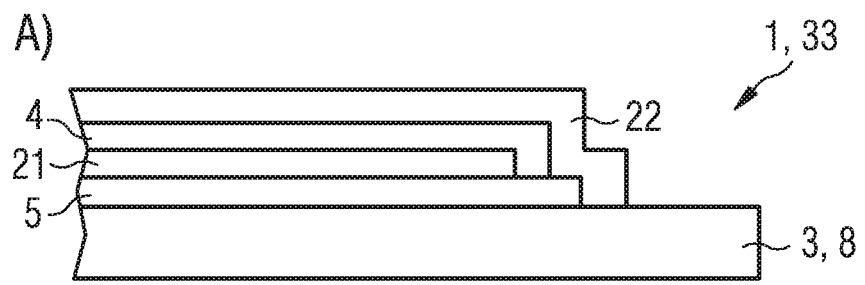
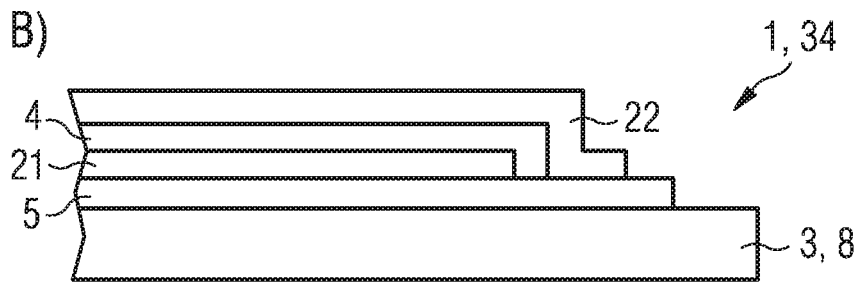
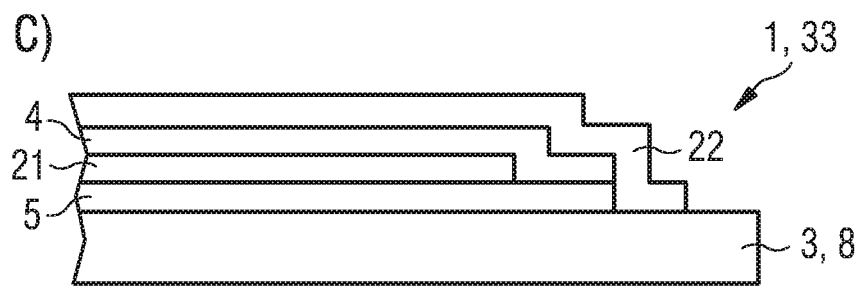
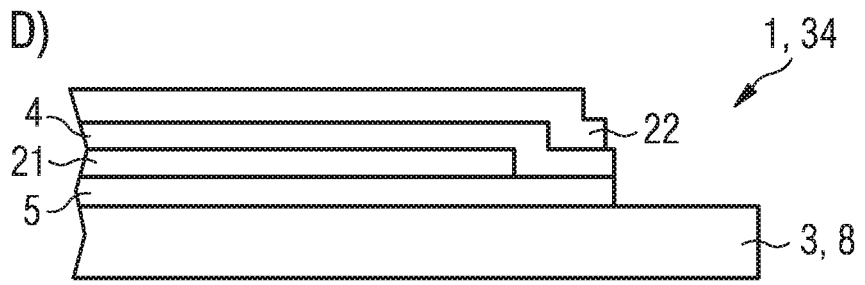

ORGANIC LIGHT-EMITTING DIODE AND VEHICLE EXTERIOR LIGHTING

An organic light-emitting diode is provided. A vehicle exterior lighting comprising such an organic light-emitting diode is also provided.

The aim of the invention is to provide an organic light-emitting diode in which a homogeneity of a luminous area can be set efficiently with regard to a radiated light intensity.

This object is achieved, inter alia, by an organic light-emitting diode having the features of patent claim 1. Preferred developments are the subject matter of the remaining claims.

According to at least one embodiment, the organic light-emitting diode has a first electrode. The first electrode has a first electrical conductivity which is comparatively high. For example, the first electrical conductivity is such that the layer resistance of the first electrode is at most $1\Omega/\square$ or $0.1\Omega/\square$ or $0.01\Omega/\square$. Here and below, the terms low layer resistance and high electrical conductivity on the one hand, and high layer resistance and low electrical conductivity on the other hand, are used synonymously.

According to at least one embodiment, the light-emitting diode has a second electrode. The second electrode has a lower, second electrical conductivity. By way of example, the second electrical conductivity is such that the layer resistance of the second electrode is at least $1\Omega/\square$ or $5\Omega/\square$ or $20\Omega/\square$ or $100\ \Omega/\square$.

According to at least one embodiment, an organic layer stack is located between the two electrodes. The organic layer stack is designed to generate light. For example, in the operation of the light-emitting diode colored or white light is generated in the layer stack.

According to at least one embodiment, the organic layer stack is directly adjacent to the first electrode and to the second electrode, in the direction perpendicular to the organic layer stack. In this case, the organic layer stack is preferably formed only from layers which have, or consist of, organic materials. The two electrodes are preferably inorganic electrodes. In contrast to the organic layer stack, the two electrodes can be ohmic conductive.

According to at least one embodiment, the organic layer stack has an outer contour line when viewed in a plan view. In other words, the contour line is an outer silhouette of the organic layer stack.

According to at least one embodiment, the organic light-emitting diode comprises a current distribution layer. The current distribution layer has a third electrical conductivity. The third electrical conductivity is comparatively high and preferably at least as large, or larger, than the first electrical conductivity. In particular, the first and/or the third electrical conductivity are designed in such a manner that no, or no significant, voltage drop occurs across lateral dimensions of the organic light-emitting diode due to a resistance of the first electrode and/or of the current distribution layer.

According to at least one embodiment, the organic light-emitting diode comprises one or more contact regions. The at least one contact region is located outside the contour line, seen in plan view. The second electrode and the current distribution layer touch each other in the at least one contact region. The current distribution layer and the second electrode are thus arranged in the contact region, in particular exclusively in the contact region or in the contact regions. By means of the current distribution layer it is possible to provide the second electrode which has the only comparatively low second electrical conductivity with current at a plurality of points, and thus to prevent or reduce a voltage drop across the second electrode.

According to at least one embodiment, the light-emitting diode comprises one or more current block regions. In the at least one current block region, the current distribution layer is located completely within the contour line, seen in plan view. In other words, there is no point of the second electrode along the contour line in the current block region which is in electrical contact with the current distribution layer. This means in particular that the organic layer stack is located between the second electrode and the current distribution layer so that an electrical insulation of the second electrode from the current distribution layer by the organic layer stack is realized in the current block region.

According to at least one embodiment, an electrical insulating layer is located in at least one current block region or in all current block regions between the second electrode and the current distribution layer. In this case, the first electrode is preferably applied directly to the insulating layer and the active layer stack is applied directly to the first electrode and preferably in places to the insulating layer. Thus, in such a current block region the second electrode is electrically isolated from the current distribution layer by the insulating layer. Optionally, it is possible for both the insulating layer and the active layer stack to be arranged between the current distribution layer and the second electrode.

According to at least one embodiment, an allocation of the at least one contact region and of the at least one current block region is configured to purposefully set a luminance of the organic layer stack and/or a luminous area of the light-emitting diode. In particular, an outer contour of the luminous area can be set via a combination of the contact regions and the current block regions and their spatial allocation and arrangement. In addition, the current block regions can be used to avoid that locally more current is impressed in the organic layer stack on account of edge effects. Thus, regions arranged at the edge of the luminous area, in particular in corner regions, that appear bright can be avoided or reduced in their extent through the current block regions.

In at least one embodiment, the organic light-emitting diode comprises a first electrode having a first electrical conductivity and a second electrode having a second, lower electrical conductivity. An organic layer stack for generating light is located between the two electrodes. Viewed in a plan view, the organic layer stack has an outer contour line. Furthermore, the organic light-emitting diode comprises a current distribution layer having a third, high electrical conductivity. Viewed in a plan view, a plurality of contact regions are located outside the contour line. The second electrode and the current distribution layer touch each other in the contact regions and are electrically connected to one another. In at least one current block region, the current distribution layer is located completely within the contour line, so that the second electrode is electrically isolated from the current distribution layer. Particularly preferably, a luminance of a luminous area of the organic layer stack and/or of the light-emitting diode is specifically set via a distribution of the contact regions and of the at least one current block region.

For example, in organic light-emitting diodes, OLEDs for short, which have, for example, light-transmissive carrier substrates made of glass with ITO, a definition of a luminous area is possible only in a comparatively complex manner by means of photolithography and/or by means of printing processes and via the use of photoresists to form an edge passivation. A homogeneity of the luminous area can thereby be optimized by setting a voltage drop across metal feed lines to an anode at all feed points as uniformly as possible. This can be achieved, for example, by selecting a distance to all feed points to be as equal as possible. If all the feed points are arranged on one side, this can be achieved, for example, by introducing so-called inversion points in the metal feeds.

Likewise, a possibility for homogenizing a luminance of transparent OLEDs lies in generating so-called recovery regions, wherein an electrical conductivity in the return regions is made smaller than in other current feed regions. Such organic light-emitting diodes can be found in particular in the publication DE 10 2010 003 121 A1. The disclosure content of this publication with regard to the electrodes used and with regard to the organic layer stack is incorporated by reference.

In the case of the organic light-emitting diode described here, no photoresists are required for edge insulation of the electrodes. In particular, this makes it possible to realize a mechanically flexible OLED. In the invention described here, electrical feed regions are set, for instance for a cathode, so that overlap regions between the cathode and a current-carrying layer are varied. For example, seen in a plan view, the cathode overlaps in the region of indentations of the organic layer stack only in an inner region of the indentation, but not along flanks.

According to at least one embodiment, the organic layer stack and/or the first electrode, viewed in plan view, completely lie within the insulating layer. Alternatively or additionally, in particular with the exception in the region of a current supply to the first electrode, the first electrode lies completely within the organic layer stack, seen in plan view.

According to at least one embodiment, the organic light-emitting diode comprises an electrical insulating layer. In particular, the first electrode is applied directly to the insulating layer. In this case, the insulating layer can project beyond the first electrode all around, viewed in a plan view.

According to at least one embodiment, the current distribution layer is formed by an electrically conductive carrier substrate of the light-emitting diode. For example, the current distribution layer is an electrically conductive foil such as a metal foil or an at least partially electrically conductively coated plastic foil or an at least partially electrically conductively coated glass foil. In the case of a metal foil, it is, for example, a foil made of copper, aluminium, magnesium, steel, stainless steel, nickel or alloys thereof or combinations thereof.

According to at least one embodiment, the insulating layer is mounted on the current distribution layer. In this case, the insulating layer preferably directly adjoins the current distribution layer and the first electrode preferably directly adjoins the insulating layer. The current distribution layer preferably extends over the insulating layer all around, seen in a plan view. It is thus possible for the insulating layer to extend completely between the current distribution layer and the first electrode, so that the first electrode does not touch the current distribution layer at any point and is electrically isolated from the current distribution layer.

According to at least one embodiment, in the direction perpendicular to the organic layer stack, the first electrode is separated from the current distribution layer which is configured as a carrier substrate by the insulating layer. This prevents a short circuit between the first electrode and the current distribution layer.

According to at least one embodiment, in at least one of the current block regions, preferably in exactly one or in exactly two current block regions, the first electrode is guided out of the contour line to a contact surface for electrically contacting the organic light-emitting diode. The electrical contact surface is thus located remote from the organic layer stack and outside the contour line, seen in a plan view. The region of the first electrode, which is guided towards the external contact surface, preferably serves only for supplying current to the electrical electrode within the contour line and then has no further function.

According to at least one embodiment, in one or, preferably, in a plurality of the contact regions, the first electrode lies completely within the contour line. In these contact regions, no current is supplied from outside the contour line to the first electrode.

According to at least one embodiment, external electrical contacts for contacting the second electrode are attached to the current distribution layer. This means that the second electrode is electrically contacted externally only indirectly via the current distribution layer. It is possible, when viewed in a plan view, that the current distribution layer projects beyond the second electrode all around so that, viewed in a plan view, the second electrode lies completely within the current distribution layer.

According to at least one embodiment, an outer edge of the second electrode and the contour line, viewed in a plan view, cross each other at a boundary between the current block region and the contact region. For at least one such boundary, the angle between the outer edge and of the contour line is small and is at least 1° or 3° or 5°. Alternatively or additionally, the angle is at most 30° or 20° or 15° or 10° or 5°.

According to at least one embodiment, the luminance is homogeneous over the luminous area of the light-emitting diode. This means, in particular, that a homogeneity is at least 90%. The homogeneity H is obtained from the quotient of the difference between the maximum luminance Lmax and the minimum luminance Lmin of the sum of maximum luminance Lmax and the minimum luminance Lmin, as present in the luminous area: H=[1−(Lmax−Lmin)/(Lmax+Lmin)]*100%.

According to at least one embodiment, the light-emitting diode has a plurality of current block regions which are separated from one another and lie along the contour line. A proportion of the current block regions on the contour line is preferably at most 30% or 10% or 5% or 2.5%. Alternatively or additionally, this proportion is at least 0.1% or 0.3% or 1% or 5%.

According to at least one embodiment, the luminance is set in a targeted manner inhomogeneously across the luminous area of the light-emitting diode. Inhomogeneous means in particular that the homogeneity is at most 70% or 60%. By means of a specifically inhomogeneous luminance, luminous effects can be achieved, in particular a so-called 3D effect. In the case of a 3D effect, by the luminance distribution the impression of a viewer that the light-emitting diode is curved and has a bent shape is given or amplified.

According to at least one embodiment, wherein the luminance is preferably set inhomogeneously, a proportion of the current block regions along the contour line is at least 50% or 70% or 80% or 90% or 95%. Alternatively or additionally, this proportion is then at most 99% or 98% or 95%. In other words, along the contour line a large part of the second electrode is electrically separated from the current distribution layer.

According to at least one embodiment, a mean distance between the contour line and an outer edge of the second electrode and/or a mean distance between the contour line and one outer edge of the insulating layer at least 0.1 mm or 0.2 mm. Alternatively or additionally, this average distance is at most 0.8 mm or 0.6 mm or 0.4 mm or 0.3 mm. Furthermore, it is possible that the contour line and the outer edge of the insulating layer terminate flush with one another so that in this case the average distance is equal to zero.

According to at least one embodiment, a mean distance between the contour line and the outer edge of the second electrode is smaller in the current block region(s) than the corresponding mean distance in the contact regions, in at least one or in all current block regions beside such current block regions for connection to an external electrical contact region. For example, said mean distance in the current block regions is then at least 0.01 mm or 0.05 mm and/or at most 0.4 mm or 0.2 mm or 0.1 mm.

According to at least one embodiment, the luminous area, viewed in a plan view, has an incision or an indentation. That is to say that no light is emitted by the light-emitting diode in the indentation or in the incision. Viewed in a plan view, the incision or the indentation is designed, for example, in a U-shaped or V-shaped manner.

According to at least one embodiment, a ratio of a depth and a width of the incision is at least 5 or 8 or 12. Alternatively or additionally, this ratio is at most 20 or 10 or 8. The width is preferably a width of the incision in the direction parallel to and at the contour line, as would appear without the incision. The depth is preferably a maximum distance within the incision to the contour line, as would appear without the incision. The contour line without the incision is preferably approximated by a cubic spline, alternatively by a linear interpolation.

According to at least one embodiment, the first electrical conductivity of the first electrode differs from the second electrical conductivity of the second electrode at least by a factor of 5 or 10 or 50. Alternatively or additionally, this difference amounts to at most a factor of 1000 or 200 or 120. The different electrical conductivities can be adjusted, for example, by a thickness and/or a material selection of the electrodes.

According to at least one embodiment, the second electrode is permeable to the light generated in the organic layer stack. Alternatively or additionally, the first electrode is a mirror for the light generated during operation of the light-emitting diode.

According to at least one embodiment, the organic light-emitting diode is mechanically flexible. This means, in particular, that the light-emitting diode can be bent once or several times as intended, preferably reversibly with a bending radius of 40 mm or less or of 30 mm or less or of 20 mm or less or of 10 mm or less or of 5 mm or less. It is possible for flexibility to be present only along one direction or also along two main directions of expansion of the light-emitting diode that are orthogonal to one another. In this case, it is possible for the current distribution layer to be formed by a mechanically flexible film to which the further components of the organic light-emitting diode are applied.

According to at least one embodiment, the insulating layer projects beyond the second electrode in at least one current block region, viewed in a plan view. In other words, the outer edge of the second electrode then lies in a plan view above the insulating layer in places.

According to at least one embodiment, the second electrode completely covers the insulating layer in at least one further current block region. This can mean that the outer edge of the second electrode does not intersect the insulating layer at this current block region.

According to at least one embodiment, the insulating layer is flat. This can mean that the insulating layer runs only in exactly one plane. In particular, the insulating layer is not applied to the first electrode and/or to the organic layer stack and/or to the second electrode. In the context of producing the light-emitting diode, the insulating layer is particularly preferably produced completely prior to the first electrode. In particular, the insulating layer is designed in a stepless manner.

According to at least one embodiment, the contour line of the organic layer stack is curved all around or in places. Alternatively or additionally, it is possible for the contour line to have one or more kinks, in which the contour line undergoes a direction change of ≠90°. In other words, the organic layer stack is then not a square or a rectangle when viewed in a plan view.

The organic light-emitting diode described here can be produced without additional lacquer layers or insulating layers for electrically insulating edges of the organic layer sequence, wherein a homogeneous light emission can be achieved. It is likewise possible to specifically achieve luminance gradients by the configuration of the current block regions and of the contact regions, in order to amplify 3D effects in bent light-emitting diodes or to highlight a design to a greater extent according to requirements of a light-emitting diode customer.

Furthermore, it is possible that, in particular in the region of an incision or an indentation, a distance between adjacent luminous area regions can be made smaller than in conventional light-emitting diodes, that is to say narrower indentations or finger structures can be produced into the luminous area. This can be achieved, in particular, in that at critical points an overlap region and/or an electrical contact region between the second electrode and the current distribution layer can be dispensed with. It is thus possible in the case of organic light-emitting diodes produced by means of vapour deposition that finger structures can be designed to be narrower than specified by positioning tolerances of a vaporization system per se, in that overlap regions between the cathode and the current distribution layer are adapted accordingly.

Furthermore, a vehicle exterior lighting is specified. The vehicle exterior lighting comprises one or more of the organic light-emitting diodes as indicated in connection with one or more of the above-mentioned embodiments. Features of the organic light-emitting diode are therefore also disclosed for the vehicle exterior lighting and vice versa.

In at least one embodiment, the light-emitting diode is arranged in a curved manner in the vehicle exterior lighting. Alternatively or additionally, the light-emitting diode has at least one incision or a bulge, viewed in a plan view of the light-emitting diode.

The vehicle exterior lighting is, for example, a daytime running light, a back light or a brake light, preferably for a car.

In the following, an organic light-emitting diode described here and a vehicle exterior lighting described here are explained in more detail with reference to the drawing on the basis of exemplary embodiments. Identical reference signs indicate the same elements in the individual figures. In this case, however, no relationships to scale are illustrated, but rather individual elements can be represented with an exaggerated size in order to afford a better understanding.

Figure 11:
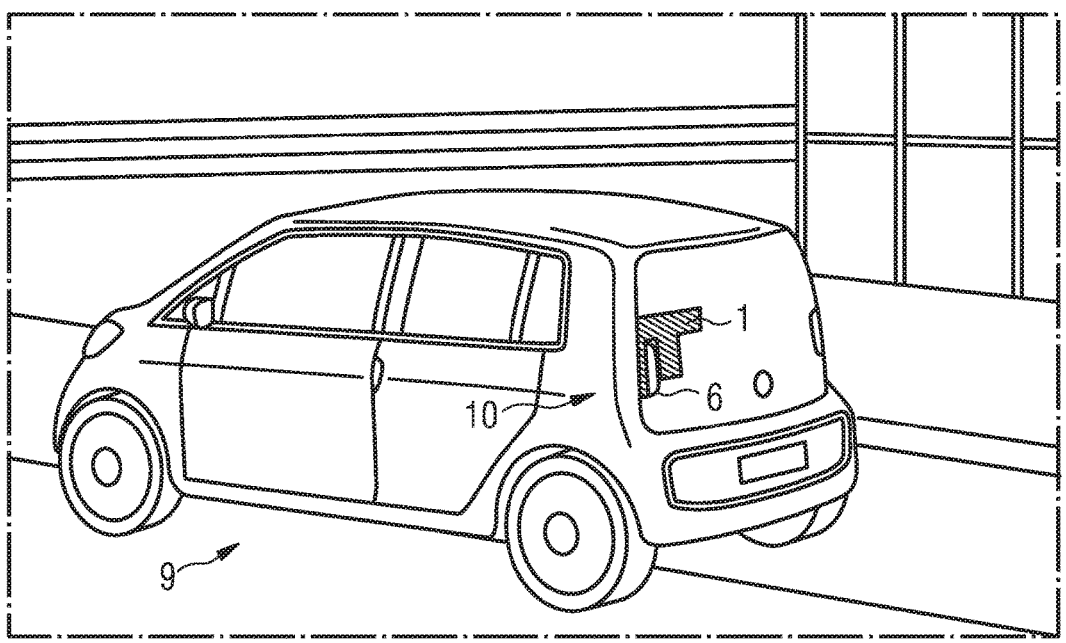
Figure 13:
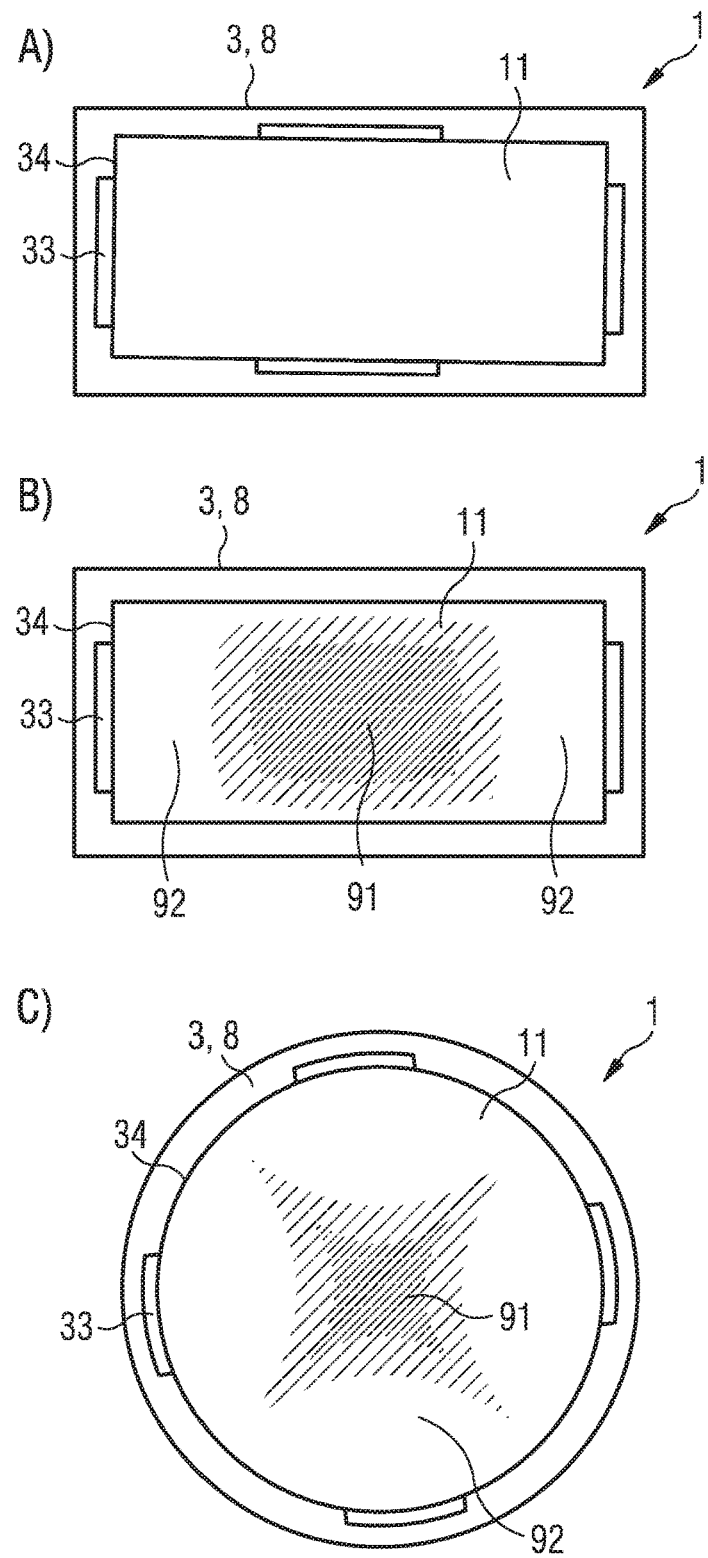

In the Figures:

FIGS. 1, 2, 5, 6, 7, 10 and 13 show schematic plan views of exemplary embodiments of organic light-emitting diodes described here, FIGS. 3, 4, 9 and 12 show schematic sectional representations of exemplary embodiments of organic light-emitting diodes described here, FIG. 8 shows a sectional illustration of a modification of an organic light-emitting diode, and FIG. 11 shows a schematic perspective illustration of an exemplary embodiment of an external vehicle lighting system having an organic light-emitting diode described here.

FIG. 1 shows an exemplary embodiment of an organic light-emitting diode 1. The light-emitting diode 1 comprises an organic layer stack 4 for generating light. The areal organic layer stack 4 is located on a current distribution layer 3, which according to FIG. 1 also serves as a carrier substrate 8. The organic light-emitting diode 1 is mechanically flexible. A luminous area 11 of the light-emitting diode 1 has a complex shaping, seen in plan view. Various details from FIG. 1 are explained in more detail in FIGS. 2 to 7.

The luminous area 11 has three incisions 6. In the region A, the incision 6 tapers towards a centre of the luminous area 11. In the region B, the incision 6 widens first and then runs similarly to a circular arc. In the region C, the incision 6 has a constant width.

Figure 2:
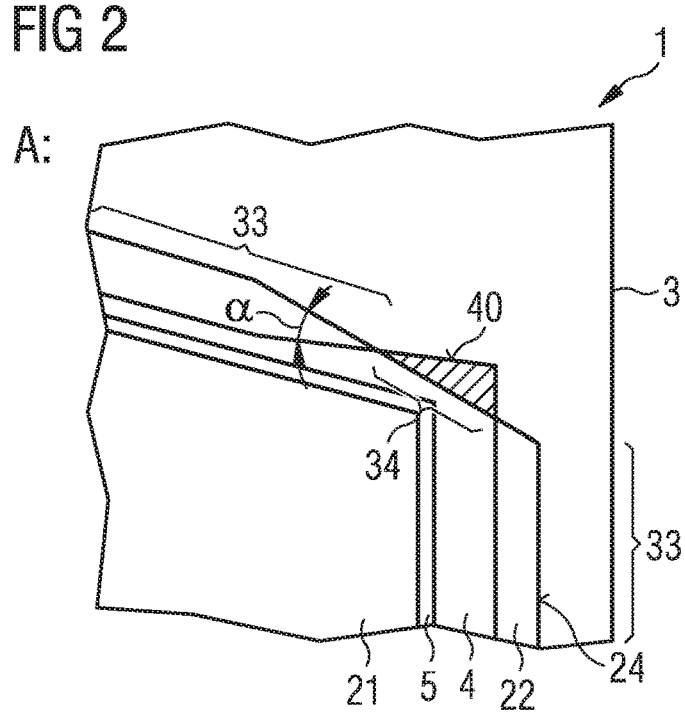

The region A from FIG. 1 is illustrated in greater detail in FIG. 2, see also the sectional representations in FIGS. 3 and 4. The organic layer stack 4 is located between a first electrode 21 and a second electrode 22. The carrier substrate 8, which constitutes the current distribution layer 3, is formed from a continuous, homogeneous and electrically conductive material. In order to avoid short circuits, an electrical insulating layer 5 is located between the current distribution layer 3 and the first electrode 21 so that an electrical connection between the current distribution layer 3 and the first electrode 21 is provided only indirectly via the organic layer stack 4.

The current distribution layer 3 is, for example, a steel foil, alternatively also an aluminum foil or a copper foil. Preferably, a thickness of the current distribution layer 3 is at least 10 µm or 50 µm or 75 µm and/or at most 500 µm or 350 µm or 150 µm, in particular approximately 100 µm. If the current distribution layer 3 is applied as a coating to an electrically insulating substrate, for instance made of plastic, the layer thickness of the current distribution layer 3 is preferably at least 100 nm or 300 nm or 500 nm and/or at most 2 µm or 1 µm or 500 nm.

The insulating layer 5 is preferably formed from a plastic, for example of PA, PI, BPA, a lacquer or an epoxide. A thickness of the insulating layer 5 is in particular constant and is, for example, at least 1 µm or 3 µm and/or at most 30 µm or 20 µm or 10 µm, in particular at approximately 5 µm in the case of BPA, bisphenol A.

The first electrode 21 is a reflective mirror layer. In the exemplary embodiment shown, the first electrode 21 is designed, for example, as an anode, alternatively, however, it can also be a cathode. A material of the first electrode is preferably silver or also aluminium. A thickness of the first electrode is, for example, at least 50 nm or 100 nm or 200 nm and/or at most 5 µm or 1 µm or 0.7 µm. The thickness of the first electrode 21 is preferably approximately 500 nm.

The organic layer stack 4 has an active layer for generating light, but can also have a plurality of active layers for generating light of different wavelengths. For example, a thickness of the organic layer stack 4 is at least 0.3 µm and/or at most 1.2 µm.

In this exemplary embodiment, the second electrode 22 is accordingly a cathode, alternatively an anode. The second electrode 22 is light-transmissive. A thickness of the second electrode 22 is preferably at least 5 nm or 14 nm and/or at most 30 nm or 20 nm, when the second electrode is made of a metal. If the second electrode 22 is made of a transparent conductive oxide such as ITO, the second electrode 22 can also have a greater thickness, for example at least 40 nm and/or at most 250 nm. In particular, the second electrode 22 is produced from magnesium-doped silver having a thickness of approximately 16 nm. Alternatively, the second electrode 22 can be produced from silver nanowires.

The luminous area 11 preferably has a comparatively large lateral extent. For example, an average lateral extent of the luminous area 11 is at least 0.05 m or 0.1 m or 0.2 m. Alternatively or additionally, the average lateral extent of the luminous area 11 is at most 1 m or 0.7 m or 0.3 m. It is possible that light of the same spectral composition is emitted over the entire luminous area 11. In particular, it is possible for the luminous area 11 not to be subdivided into sub-units which can be electrically switchable independent of one another. In contrast to this, the luminous area 11 can be divided into a plurality of partial regions and can thus be pixelated.

In conventional organic light-emitting diodes the second electrode 22, which is electrically less conductive, is electrically connected all around to the current distribution layer 3 so that current is impressed into the second electrode 22 all around. Local energizing peaks can then occur, for example, in corner regions of the second electrode 22 and of the organic layer stack 4, which manifest in an increased brightness of the luminous area 11 in such corner regions. However, such inhomogeneities are not desired in many applications.

In the representation of the detail A in FIG. 2, it can be seen that a current blocking region 34 and contact regions 33 are formed in relation to the second electrode 22. In the contact regions 33, the second electrode 22 is in direct contact with the current distribution layer 3, see also FIG. 3.

In contrast, the organic layer stack 4 is located in the current block region 34 between the second electrode 22 and the current distribution layer 3, see also FIG. 4. Thus, in the current block region 34 a current impression into the second electrode 22 is prevented. Boundaries between the current block regions 34 and the contact regions 33 are formed by an intersection of an outer contour line 40 of the organic layer stack 4 with an outer edge 24 of the second electrode 22.

The outer contour line 40 and the outer edge 24 intersect at at least one of the boundaries between the contact region 33 and the current block region 34 with a small angle a. The angle a is, for example, approximately 15°. At the other boundary, the angle a is greater and is approximately 60°.

According to FIG. 1, an edge of the luminous area 11 in the region A has a kink of greater than 90°. In this kink area of the edge of the luminous area 11, see FIG. 2, both the first electrode 21 and the insulating layer 5 completely lie within the outer edge 24. In the contact regions 33, the contour line 40, the outer edge 24 and outer boundary lines of the first electrode 21 and of the insulating layer 5 are approximately parallel to one another. A distance between adjacent edges to one another is in the contact regions, viewed in a plan view, for example approximately 0.4 mm. In the current block region 34, these edges are preferably closer to one another than in the contact regions 33.

The layers shown in FIGS. 3 and 4 preferably follow one another directly and immediately. Deviating from the representation of FIG. 3, it is possible that the organic layer stack 4 already ends on the electrical insulating layer 5 and does not extend as far as the current distribution layer 3. Preferably, however, the organic layer stack 4 extends as far as the current distribution layer 3, as shown in FIG. 3. Further layers of the light-emitting diode 1 such as encapsulation layers are not drawn in order to simplify the illustration.

In the region B in FIG. 1, see the detailed illustration in FIG. 5, the edges of the luminous area 11 form an acute angle. In particular in the region of this acute angle, it is possible that the insulating layer 5 protrudes beyond the second electrode 22 in the current block region 34. In turn, a comparatively small angle a of approximately 20° is present at one of the boundaries between the current block region 34 and the contact region 33. A comparatively large angle a which, for example, exceeds 60° or 75° or 85°, can be present at the second boundary.

As in all other exemplary embodiments, in the detailed views of FIGS. 2 and 5 it is possible that the outer contours of the electrodes 21, 22, the insulating layer 5 and the organic layer stack 4 have no sharp kinks, but run round. The individual layers on the current distribution layer 3 are preferably produced by vapour deposition using different vapour deposition masks. Alternatively, it is possible for the individual layers to be applied to the current distribution layer 3 by means of a printing method.

Figure 6:
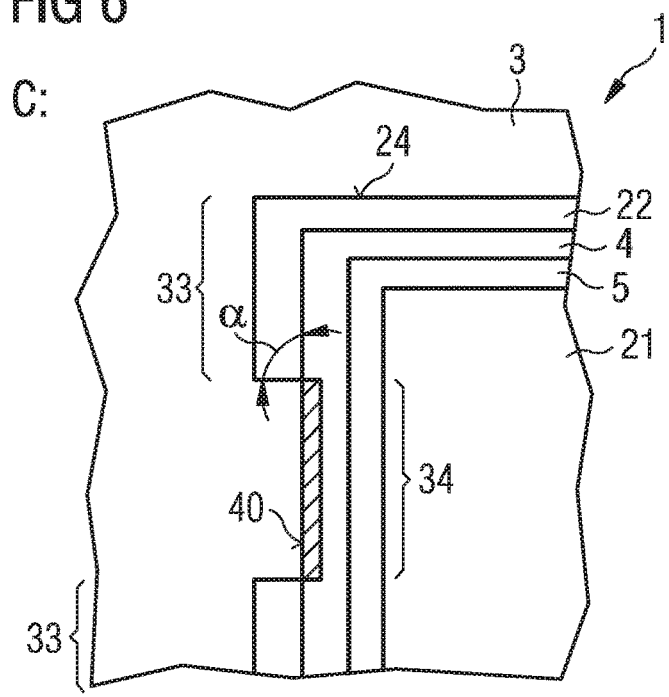

In the region C in FIG. 1, see the illustration in FIG. 6, the angle a at the boundaries between the contact regions 33 and the current block region 34 is approximately a right angle. The current block region 34 runs along the contour line 40 parallel to an edge of the first electrode 21 wherein the contour line 40 runs straight. In contrast to FIG. 2 or 5, the current block region 34 according to FIG. 6 does not lie at a corner of the first electrode 21, viewed in plan view, but at a straight edge of the first electrode 21.

Figure 7:
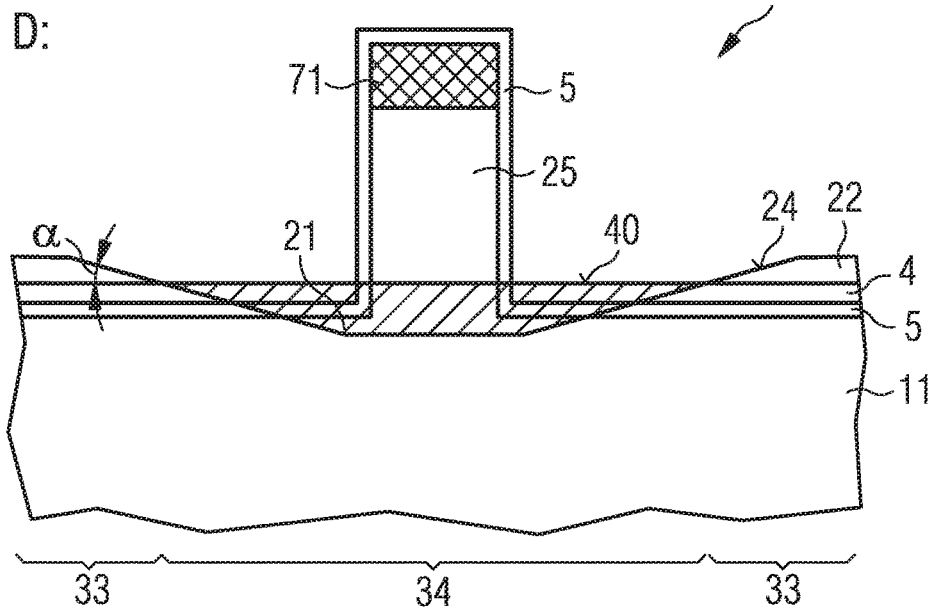

In the region D from FIG. 1, see FIG. 7, a current supply 25 of the first electrode 21 towards an electrical contact surface 71 for the first electrode 21 is located. The current supply 25 and the first electrode 21 are preferably formed in one piece. A material for the first electrode 21 and for the current supply 25 and furthermore for the contact surface 71 is located completely on the insulating layer 5. The current distribution layer 3 can be electrically contacted via a further electrical contact surface 72. For example, external power lines can be connected to the contact surfaces 71, 72 by clamping or soldering, or a flexible printed circuit board, also referred to as a flex PCB or flexible printed circuit board, can be attached, for example, by means of an electrically anisotropically conductive layer, also referred to as an ACF or an anisotropic conductive film, or by means of electrically anisotropic adhesive bonding, also referred to as ACA or anisotropic conductive adhesive.

The outer edge 24 and the contour line 40 intersect at the two boundaries between the illustrated current block region 34 and the adjacent contact regions 33 only at a small angle a of approximately 7°, wherein the angle a is of equal size at both boundaries. The luminous area 11 is defined by the shape of the first electrode 21 at the contact regions 33, since the organic layer stack 4 has only negligible lateral current conductivity. In contrast, the luminous area 11 is defined by the outer edge 24 of the second electrode 22 at the current block region 34. Because of the only small angle a, a flat transition results between the regions in which the luminous area 11 is defined by the first electrode 21 or by the second electrode 22.

In contrast, in the modification in FIG. 8, the luminous area 11 is defined by the shaping of the first electrode 21, wherein in the current supply 25 the luminous area 11 extends in the direction towards the contact surface 71. The outer edge 24 of the second electrode 22 runs along a straight line parallel to the corresponding edge of the first electrode 21. This results in a luminous surface 11' for a viewer on the current supply 25, the luminous surface 11' being clearly recognizable as a sharp-edged bulge. Such an optical impression is undesirable. In contrast, according to the exemplary embodiment of the light-emitting diode 1 in FIG. 7, by means of the small angle a, there is only a small indentation which runs flat. Due to the small angle a, the indentation can thus hardly be seen for a viewer, in particular, no sharp kinks or bulges in the luminous area 11 are visible.

In the same way, in particular by means of very small vapour deposition tolerances, external contours of the luminous area 11 with deviations ≤100 µm or ≤50 µm are also possible as is also the case in all other exemplary embodiments. This is desirable, for example, in the field of display fabrication.

FIGS. 9A to 9D show alternative embodiments for the contact region 33 and the current block region 34, which can also be present in a similar manner in all other exemplary embodiments. According to FIG. 9, a carrier substrate 8 is provided on which the first electrode 21 and the current distribution layer 3 are applied. The carrier substrate 8 is electrically insulating or provided with an electrically insulating coating, not shown.

The current distribution layer 3 can surround the first electrode 21 all around, seen in plain view. In a region of a power supply line, not shown in FIG. 9, the current distribution layer 3 can be cut out or locally separated from the first electrode 21 by an insulating layer (not shown) in the direction perpendicular to the carrier substrate 8.

In the contact region 33, the organic layer stack 4 according to FIG. 9A does not extend up to the web-shaped current distribution layer 3.

In contrast, see FIG. 9B, in the current block region 34 the current distribution layer 3 is completely covered by the organic layer stack 4 for electrical insulation.

According to FIG. 9C, the organic layer stack 4 partially covers the current distribution layer 3 in the contact region 33 and completely fills a region between the current distribution layer 3 and the first electrode 21.

In the current block region 34 of FIG. 9D, the organic layer stack 4 is partially arranged on the current distribution layer 3, but covers the latter only partly. The second electrode 22 extends in the direction away from the first electrode less far into the current distribution layer 3 than the organic layer stack 4. Compared with FIG. 9C it is possible in FIG. 9D that the second electrode 22, within the scope of production tolerances, extends to the same extent over the current distribution layer 3. The same can also apply to FIGS. 9A and 9B.

Further exemplary embodiments are shown in FIG. 10. The indentation 6 in the luminous area 11 is in each case designed in the shape of a U. According to FIG. 10A, the current block regions 34 are only present at the outer corners of the indentation 6. A continuous contact region 33 is present within the bulge 6.

In contrast, according to FIG. 10B, a further current block region 34 is additionally present at a tip of the indentation 6, in addition to the current block regions 34 at the outer corners on the indentation 6. A corresponding configuration of the current block regions 34 and the contact regions 33 is also possible in the bulges 6, as shown in FIG. 1.

Finally, FIG. 11 shows a vehicle exterior lighting 10. The vehicle exterior lighting 10 is a rear light of a car 9. The vehicle exterior lighting 10 comprises an organic light-emitting diode 1, which is applied in a curved manner, for example to a curved rear flap of the car 9. By designing the contact regions 33 and the current block regions 34, a uniform luminance in the luminous area 11 can be achieved in particular in the region of the incision 6.

FIGS. 12A to 12D show further possible embodiments for the contact region 33 and the current block region 34. In this case, the current distribution layer 3 is formed in each case by an electrically conductive carrier substrate 8. The insulating layer 5 is applied in places on the carrier substrate 8, in order to prevent a short circuit between the first electrode 21 and the carrier substrate 8. A current supply to the first electrode 21 is preferably designed analogously to FIG. 7D.

In the contact region 33 of FIG. 12A, the second electrode 22 projects beyond the insulating layer 5 along a lateral direction. The organic layer stack 4 completely covers side faces of the first electrode 21 and ends still on the insulating layer 5. The second electrode 22 is also partially located on the insulating layer 5.

In the current block region 34 of FIG. 12B, in contrast, the insulating layer 5 is guided further laterally so that the second electrode 22 no longer has any contact with the current distribution layer 3. In this case, the first electrode 21, the organic layer stack 4 and the second electrode 22 and, optionally, the current distribution layer 3 are designed in the same way as in FIG. 12A with regard to its lateral extents.

According to FIG. 12C, the insulating layer 5 and the organic layer stack 4 terminate flush with one another in the lateral direction in the contact region 33, wherein the first electrode 21 does not reach as far as an edge of the insulating layer 5. The second electrode 22 extends in a plurality of steps up to the current distribution layer 3.

In contrast to that, the second electrode 22 is set back relative to the organic layer stack 4 in the current block region 34 of FIG. 12D and ends on a plateau of the organic layer stack 4 next to the first electrode 21. In this case, the first electrode 21, the organic layer stack 4 and the insulating layer 5 and optionally also the current distribution layer 3 are designed in the same way as in FIG. 12C with regard to their lateral extents.

In the exemplary embodiment of FIG. 13A, the luminous area 11 is rectangular in plan view. An aspect ratio of this rectangle is approximately 2.5:1, but can also lie in the range between 1.5:1 and 20:1. Viewed in a plan view, both on the long and short sides of this rectangle, one of the contact regions 33 is located, seen in a plan view. Preferably, each of the contact regions 33 is arranged symmetrically to a center of the associated side of the rectangle. Current block regions 34 are in each case present in corner regions of the rectangle. At the short sides, the contact regions 33 extend preferably to at least 50% and/or to at most 85% along the rectangle; on the long sides, this value is in particular at least 20% and/or at most 60%. In this way, excess voltage at the corners can be avoided and a luminous area 11 uniformly radiating during operation of the light-emitting diode 1 can be realized.

According to FIG. 13B, the contact regions 33 lie only on short sides of the rectangle, the long sides are formed exclusively by current block regions 34. The aspect ratio of the rectangle is preferably at least 1.5:1 or 2:1 and/or at most 20:1. By such an arrangement of the contact regions 33, the luminous area 11 is divided into a dark region 91 and into bright regions 92, wherein these regions 91, 92 can gradually change into one another with regard to their brightness, without there being a sharp separation between these regions 91, 92.

In the exemplary embodiment of FIG. 13C, the luminous area 11 is circular or also oval. Several of the contact regions 33 are distributed around the luminous area 11. As a result, a star-shaped dark region 91 can be realized, surrounded by the bright region 92. Such star-shaped regions 91, 92 can also be achieved analogously in embodiments similar to FIG. 13B, in that a plurality of contact regions 33 which are spaced apart from one another are produced in particular on the long sides of the rectangle.

The precise shape of the bright regions 92 which appear brighter to a viewer and the darker dark regions 91 can be adjusted by the geometry of the contact regions 33 and the current block regions 34 around the luminous area 11. In contrast to the figures, it is also possible that the luminous area 11 comprises openings which are surrounded all around by the luminous area 11. The brightness distribution in the luminous area 11 can also be determined by means of contact regions 33 and current block regions 34 arranged in such openings.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

This patent application claims the priority of German patent application 10 2015 114 844.7, the disclosure content of which is hereby incorporated by reference.

LIST OF REFERENCE SIGNS

1 organic light-emitting diode
11 luminous area
21 first electrode
22 second electrode
24 outer edge of the second electrode
25 current supply
3 current distribution layer
33 contact region between the current distribution layer and the second electrode
34 current block region
4 organic layer stack
40 outer contour line of the organic layer stack
5 electrical insulating layer
6 incision/indentation in the luminous area
71, 72 contact surface for external electrical contacting
8 carrier substrate
9 car
91 dark region
92 bright region
10 vehicle exterior lighting
a angle between the outer edge and the contour line

The invention claimed is:
1. Organic light-emitting diode comprising:
a first electrode having a first electrical conductivity,
a second electrode having a second electrical conductivity that is lower than the first electrical conductivity,
an organic layer stack for generating light which is located between the two electrodes and which, when viewed in plan view, has an outer contour line, and
a current distribution layer having a third, high electrical conductivity so that the organic layer stack is located at least partially between the second electrode and the current distribution layer,
wherein, viewed in a plan view, in a plurality of contact regions outside the contour line, the second electrode and the current distribution layer are in contact and electrically connected to one another, and an electrical insulating layer is located between the second electrode and the current distribution layer in at least one current block region so that in the current block region the second electrode is electrically isolated from the current distribution layer by the electrical insulating layer, seen in top view, the organic layer stack and the first electrode are completely arranged within the electrical insulating layer and the first electrode is completely arranged within the organic layer stack except in a region of a current supply so that in a direction perpendicular to the organic layer stack, the first electrode is separated from the current distribution layer by the electrical insulating layer, thereby setting up the current distribution layer as a carrier substrate, and a short circuit between the first electrode and the current distribution layer is prevented.

2. The organic light-emitting diode according to claim 1, in which a distribution of the contact regions and of the at least one current block region is to set a luminance of the organic layer stack, wherein in at least one current block region the current distribution layer is completely located within the contour line so that in the current block region the second electrode is electrically isolated from the current distribution layer by the organic layer stack.

3. The organic light-emitting diode according to claim 1, in which, in plan view, an outer edge of the second electrode crosses the contour line at a boundary between at least one current block region and at least one contact region at an angle a and $1° \leq a \leq 30°$.

4. The organic light-emitting diode according to claim 1, in which the luminance is homogeneous over a luminous area of the light-emitting diode, wherein the light-emitting diode has a plurality of current block regions and a proportion of the current block regions at the contour line is at most 5%.

5. The organic light-emitting diode according to claim 1, in which the luminance is deliberately inhomogeneous over a luminous area of the light-emitting diode, wherein the light-emitting diode has a plurality of current block regions and a proportion of the current block regions at the contour line is at least 70%.

6. The organic light-emitting diode according to claim 1, in which, in a plan view, the contour line and a luminous area of the light-emitting diode have an incision, wherein a ratio of a depth and a width of the incision is at least 5.

7. The organic light-emitting diode according to claim 1, in which the first and the second electrical conductivity differ from one another by at least a factor of 10, wherein the second electrode is light-transmissive and the first electrode is specularly reflective for light.

8. The organic light-emitting diode according to claim 1, which is mechanically flexible so that the light-emitting diode can be bent reversibly with a bending radius of 40 mm or less, and wherein the current distribution layer is formed by a metal foil or by an electrically conductively coated plastic foil.

9. The organic light-emitting diode according to claim 1, in which the current distribution layer is a steel foil, an aluminum foil or a copper foil with a thickness of between 10 μm and 350 μm inclusive, the electrical insulating layer is a plastic layer having a thickness of between 1 μm and 20 μm inclusive, the first electrode is made of silver or of aluminium having a thickness of at least 150 nm, the second electrode is made of a silver alloy having a thickness of between 5 nm and 20 nm inclusive, and a mean lateral extent of the luminous area is at least 0.1 m and at most 0.7 m.

10. The organic light-emitting diode according to claim 1, in which the contour line runs in a curved manner at least in places or has at least one bend with an angle≠90°.

11. A vehicle exterior lighting comprising at least one organic light-emitting diode according to claim 1, wherein the light-emitting diode is bent and comprises at least one incision, seen in plan view.

12. Organic light-emitting diode comprising:

a first electrode having a first electrical conductivity, a second electrode having a second electrical conductivity that is lower than the first electrical conductivity, an organic layer stack for generating light which is located between the two electrodes and which, when viewed in plan view, has an outer contour line, and a current distribution layer having a third, high electrical conductivity so that the organic layer stack is located at least partially between the second electrode and the current distribution layer, wherein, viewed in a plan view, in a plurality of contact regions outside the contour line, the second electrode and the current distribution layer are in contact and electrically connected to one another, and in at least one current block region, an electrical insulating layer protrudes beyond the second electrode, and in at least one further current block region the second electrode completely covers the electrical insulating layer, the electrical insulating layer is located between the second electrode and the current distribution layer, so that in the current block region the second electrode is electrically isolated from the current distribution layer.

13. Organic light-emitting diode comprising:

a first electrode having a first electrical conductivity, a second electrode having a second electrical conductivity that is lower than the first electrical conductivity, an organic layer stack for generating light which is located between the two electrodes and which, when viewed in plan view, has an outer contour line, and a current distribution layer having a third, high electrical conductivity so that the organic layer stack is located at least partially between the second electrode and the current distribution layer, wherein, viewed in a plan view, in a plurality of contact regions outside the contour line, the second electrode and the current distribution layer are in contact and electrically connected to one another, the current distribution layer is formed by an electrically conductive carrier substrate of the light-emitting diode and an electrical insulating layer is arranged on the current distribution layer so that the electrical insulating layer is in its entirety arranged between the current distribution layer and the first electrode, and in a first current block region, the first electrode protrudes out of the contour line to a contact surface for external electrical contacting, and in a second current block region, the first electrode lies completely within the contour line so that in the second current block region, the organic layer stack is located partially or completely directly between the second electrode and the current distribution, so that in both the first current block region and the second current block region, the second electrode is electrically isolated from the current distribution layer.

\* \* \* \* \*